(12) United States Patent
Foote

(10) Patent No.: US 7,291,541 B1
(45) Date of Patent: Nov. 6, 2007

(54) SYSTEM AND METHOD FOR PROVIDING IMPROVED TRENCH ISOLATION OF SEMICONDUCTOR DEVICES

(75) Inventor: Richard W. Foote, Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 80 days.

(21) Appl. No.: 10/803,273

(22) Filed: Mar. 18, 2004

(51) Int. Cl.
  *H01L 21/762* (2006.01)
(52) U.S. Cl. ............... 438/430; 257/E21.546
(58) Field of Classification Search ........ 438/424, 438/425, 430, FOR. 227; 257/E21.546
  See application file for complete search history.

(56) References Cited

U.S. PATENT DOCUMENTS

| | | | |
|---|---|---|---|
| 4,369,565 A * | 1/1983 | Muramatsu ............... | 438/430 |
| 4,577,395 A * | 3/1986 | Shibata ................. | 438/386 |
| 4,631,803 A | 12/1986 | Hunter et al. | |
| 4,835,115 A | 5/1989 | Eklund | |
| 4,983,226 A | 1/1991 | Hunter et al. | |
| 5,106,777 A | 4/1992 | Rodder | |
| 5,358,891 A | 10/1994 | Tsang et al. | |
| 5,448,102 A | 9/1995 | Gaul et al. | |
| 5,468,676 A | 11/1995 | Madan | |
| 5,474,953 A | 12/1995 | Shimizu et al. | |
| 5,486,714 A * | 1/1996 | Hong ..................... | 257/321 |
| 5,581,110 A * | 12/1996 | Razouk et al. ............ | 257/513 |
| 5,607,875 A * | 3/1997 | Nishizawa et al. ........ | 438/404 |
| 5,683,908 A | 11/1997 | Miyashita et al. | |
| 5,753,554 A * | 5/1998 | Park .................... | 438/296 |
| 5,776,808 A * | 7/1998 | Muller et al. ............ | 438/243 |
| 5,872,044 A | 2/1999 | Hemmenway et al. | |
| 5,874,317 A | 2/1999 | Stolmeijer | |
| 5,920,108 A | 7/1999 | Hemmenway et al. | |
| 5,945,704 A * | 8/1999 | Schrems et al. .......... | 257/301 |
| 6,069,057 A | 5/2000 | Wu | |
| 6,613,690 B1 * | 9/2003 | Chang et al. ............ | 438/712 |
| 6,624,044 B2 * | 9/2003 | Ito et al. ............... | 438/425 |
| 6,825,078 B1 * | 11/2004 | Huang .................. | 438/242 |
| 2001/0039088 A1 * | 11/2001 | Aoki et al. ............. | 438/244 |
| 2002/0076880 A1 * | 6/2002 | Yamada et al. .......... | 438/243 |
| 2004/0018676 A1 * | 1/2004 | Park ................... | 438/221 |
| 2005/0170661 A1 * | 8/2005 | Economikos et al. ...... | 438/759 |

OTHER PUBLICATIONS

Naresh Thapar et al., "Elimination of the "Birds Beak" in Trench MOS-Gate Power Semiconductor Devices", Power Semiconductor Research Center, 1996 IEEE, pp. 83-86.

G. Fallico et al., "A New Process for Defect-Free Definition of Active Areas in Deep Trench Isolated Bipolar Devices", Microelectronic Engineering 15 (1991) pp. 655-658.

(Continued)

Primary Examiner—George Fourson

(57) ABSTRACT

A system and method is disclosed for providing improved trench isolation of semiconductor devices. An isolation trench of the present invention is manufactured as follows. A substrate of a semiconductor device is provided and a trench is etched in the substrate. Then a silicon liner is grown in the trench. The trench is then filled with polysilicon material. Polysilicon material is also deposited on top of the filled trench to protect the silicon dioxide liner from the effects of subsequent etch procedures and oxidation procedures. The initial height of the polysilicon material is selected to be large enough to allow the polysilicon material to survive the subsequent etch procedures and oxidation procedures.

18 Claims, 6 Drawing Sheets

OTHER PUBLICATIONS

R. Bashir et al., "PLATOP: A Novel Planarized Trench Isolation and Field Oxide Formation Using Poly-Silicon", IEEE Electron Device Letters, vol. 17, No. 7, Jul. 1996, pp. 352-354.

H. Bernhard Pogge, "The Spaces Between the Functions On a Chip", Chemtech, Mar. 1986, pp. 168-173.

R. Jerome et al., "The Effect of Trench Processing Conditions on Complementary Bipolar Analog Devices with SOI/Trench Isolation", IEEE 1993 Bipolar Circuits and Technology Meeting 3.2, pp. 41-44

* cited by examiner

SYSTEM AND METHOD FOR PROVIDING IMPROVED TRENCH ISOLATION OF SEMICONDUCTOR DEVICES

TECHNICAL FIELD OF THE INVENTION

The present invention is generally directed to manufacturing technology for semiconductor devices and, in particular, to a system and method for providing improved trench isolation of semiconductor devices.

BACKGROUND OF THE INVENTION

Trench isolation is commonly used in semiconductor integrated circuits. Trench isolation provides improved isolation performance with regard to leakage and breakdown voltage. Trench isolation also takes less space than other methods such as junction isolation or LOCOS (Local Oxidation of Silicon).

The desire to save space causes trenches to be etched with high aspect ratios. A high aspect ratio for a trench means that the trench has a large vertical depth relative to the lateral width of the trench. Trenches that have a high aspect ratio are often filled with polysilicon that is deposited by low pressure chemical vapor deposition (LPCVD). LPCVD polysilicon is highly conformal and is able to coat the walls and bottom of a trench far from the surface of a wafer.

Polysilicon has the added advantage that it has the same thermal expansion coefficient as the surrounding monocrystalline silicon in which the semiconductor device is built. However, because polysilicon is not an insulator, the polysilicon must be separated from the adjacent monocrystalline silicon areas on either side of the trench with an insulator. The insulator that is most often used is a thermally grown silicon dioxide layer.

During subsequent processing steps the silicon dioxide layer can cause problems. One problem is that the silicon dioxide layer can be attacked during wafer etching and precleaning. This may cause portions of the silicon dioxide layer to be eroded. Erosion of the silicon dioxide layer can leave a gap between a monocrystalline silicon portion and an adjacent polysilicon portion. The gap can trap undesirable materials, thereby compromising the isolation properties of the trench and causing the semiconductor device to fail.

Another problem is that the silicon dioxide layer provides a diffusion conduit for oxidizing species (e.g., oxygen or steam) during subsequent thermal processing. This causes oxidation along the lateral seam on both sides of the polysilicon of the trench structure as well as on the adjacent walls of monocrystalline silicon. Because silicon dioxide occupies approximately twice as much space as the space of silicon that it consumes, the volume of material in the oxidized region of the trench expands substantially. This expansion creates stresses that cause defects (e.g., cracks) in the monocrystalline silicon areas. These defects can lead to leakage within the semiconductor device that the trench is designed to isolate. It is possible that the defects can even lead to the failure of the semiconductor device.

Therefore, there is a need in the art for a system and method for providing improved trench isolation for semiconductor devices in an integrated circuit. There is a need in the art for a system and method for manufacturing an isolation trench that does not expose the seams of polysilicon portions and adjacent monocrystalline silicon portions to subsequent etching and oxidation.

SUMMARY OF THE INVENTION

To address the above-discussed deficiencies of the prior art, it is a primary object of the present invention to provide a system and method for providing improved trench isolation of semiconductor devices.

In one advantageous embodiment of the present invention a trench isolation structure is constructed in the following manner. First an underlying monocrystalline silicon substrate layer is provided. Then a thick silicon dioxide layer is applied to the top of the monocrystalline silicon substrate layer. Then a layer of photoresist material is then applied on top of the silicon dioxide layer. Then the photoresist is selectively exposed and developed from the trench areas. Then portions of the silicon dioxide layer are etched in the trench areas.

Then the photoresist material is removed and a silicon trench etch procedure is applied to etch trenches in the monocrystalline silicon substrate layer. Then portions of the overlying silicon dioxide layer are etched away to pull the silicon dioxide layer back from the edges of the trenches. Then a silicon dioxide liner is grown on the monocrystalline silicon substrate layer. The silicon dioxide liner covers the walls and bottom of the trenches and the horizontal surfaces of the monocrystalline silicon substrate layer that are exposed at the edges of the trenches.

Then a layer of polysilicon is deposited using a low pressure chemical vapor deposition (LPCVD) process. The polysilicon material fills the trenches and covers the silicon dioxide layer that overlies the monocrystalline silicon substrate layer. Then a polysilicon etchback process is performed to etch away the top layer of the polysilicon material.

The polysilicon etchback process leaves a portion of polysilicon material on top of each polysilicon filled trench. The portion of polysilicon material that is located over the top of each polysilicon filled trench extends laterally over the edges of the isolation trench in a shape that suggests the form of a nailhead. For this reason the portion of polysilicon material that is located over the top of each polysilicon filled trench is referred to as a polysilicon nailhead.

The initial height of silicon dioxide layer and the overetch height of the polysilicon material are optimized to establish an appropriate height for the polysilicon nailhead. The height of polysilicon nailhead must be sufficient for the polysilicon nailhead to survive subsequent etches and oxidations. Then the silicon dioxide layer is stripped away leaving the polysilicon nailheads exposed above the surface of the monocrystalline silicon substrate layer.

The polysilicon nailhead structure protects the silicon dioxide liner in the trenches. That is, during subsequent oxidations the silicon dioxide liner that is located between the polysilicon material in the trenches and the surrounding monocrystalline silicon substrate layer is protected. Subsequent oxidation processes can not reach the protected silicon dioxide liner. There will be no increase in volume in the silicon dioxide liner because the oxidized polysilicon nailhead can expand laterally and vertically. Therefore, there will be no stress due to volume increase of the silicon dioxide liner. The absence of stress means that there will be no defects in the surrounding monocrystalline silicon substrate layer.

It is an object of the present invention to provide a system and method for providing improved trench isolation of semiconductor devices.

It is also an object of the present invention to provide a system and method for manufacturing an isolation trench structure in a semiconductor device that protects a silicon dioxide liner in an isolation trench.

It is yet another object of the present invention to provide a system and method for forming a portion of a polysilicon isolation trench fill material that extends laterally over the edges of an isolation trench.

It is still another object of the present invention to provide a system and method for forming a portion of a polysilicon isolation trench fill material in the form of a polysilicon nailhead structure.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 28, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

Figure 1:
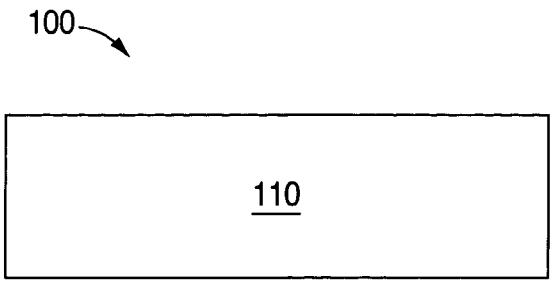
FIGS. 1 through 11 illustrate successive stages in the construction of two prior art isolation trench structures.
Figure 2:
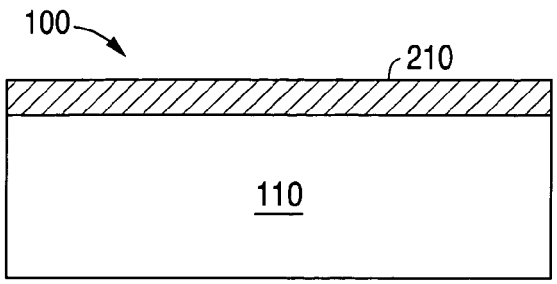

FIG. 1 illustrates a first stage in the construction of a prior art isolation trench structure 100. The construction of isolation trench structure 100 begins by providing a monocrystalline silicon substrate layer 110. As shown in FIG. 2, a thick silicon dioxide layer 210 is applied to the top of the monocrystalline silicon substrate layer 110. This is done because a silicon trench etch procedure (to be subsequently performed) attacks photoresist much faster than oxide, and because a top oxide layer during a silicon trench etch procedure enables the tapering of the trench from top to bottom.

To simplify the drawings the reference numerals from previous drawings will sometimes not be repeated for structures that have already been identified.

Figure 3:
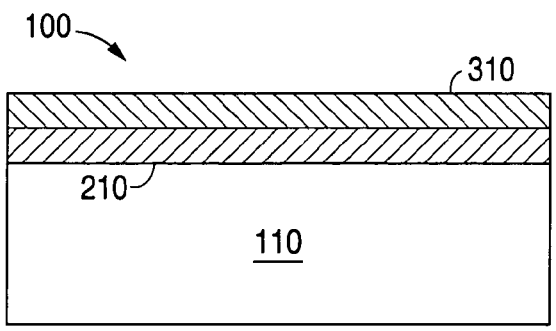
Figure 4:
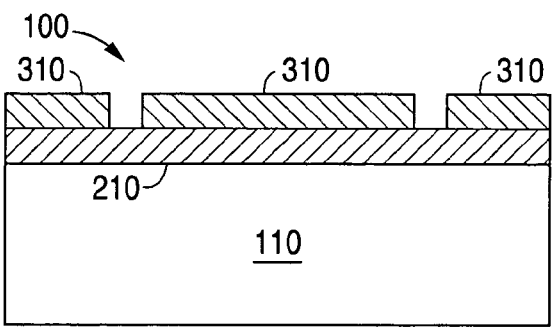
Figure 5:
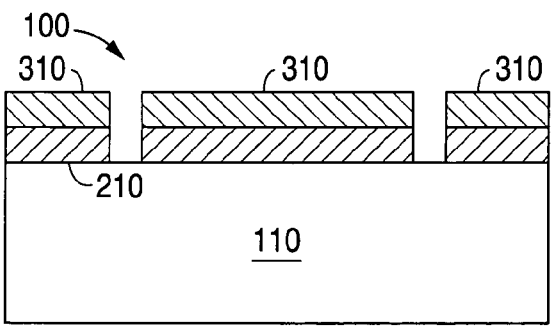

A layer of photoresist 310 is then applied on top of the silicon dioxide layer 210. The result of this step is shown in FIG. 3. Then the photoresist 310 is selectively exposed and developed from the trench area. The result of this step is shown in FIG. 4. Then portions of the silicon dioxide layer 210 are etched anisotropically in the trench areas. Photoresist 310 protects the silicon dioxide 210 that underlies the photoresist 310. The result of this step is shown in FIG. 5.

Figure 6:
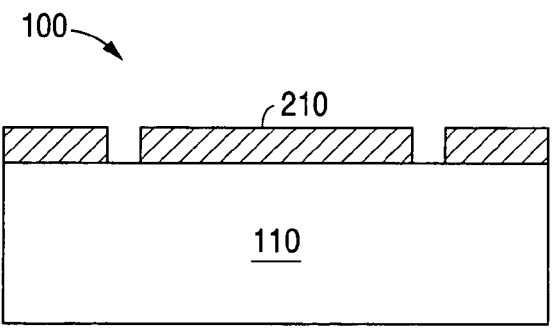

Usually the photoresist 310 is removed before the silicon trench etch procedure is applied. The result of removing the photoresist 310 is shown in FIG. 6. If the photoresist 310 is not removed at this stage then it is removed after the silicon trench etch procedure is performed and before further processing occurs.

Figure 7:
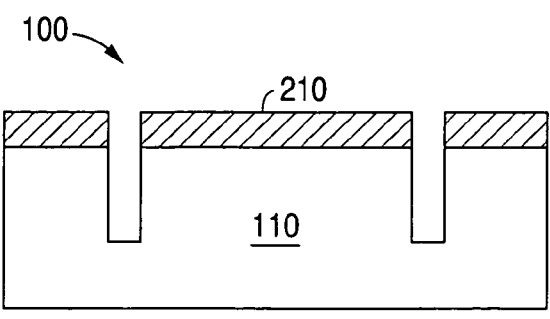

Then the silicon trench etch procedure is performed. The result of performing the silicon trench etch procedure is shown in FIG. 7. The silicon trench etch procedure will also etch the photoresist 310 if the photoresist 310 is still present on top of the silicon dioxide layer 210. The silicon trench etch procedure will also etch the silicon dioxide layer 210 if the photoresist 310 has already been removed.

Figure 8:
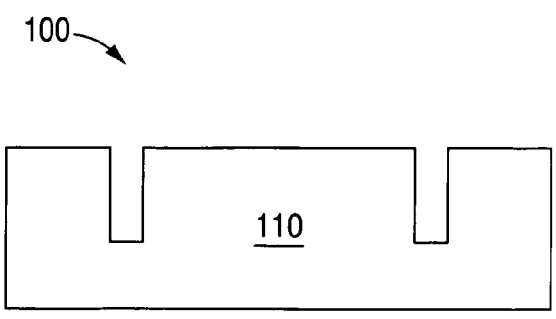
Figure 9:
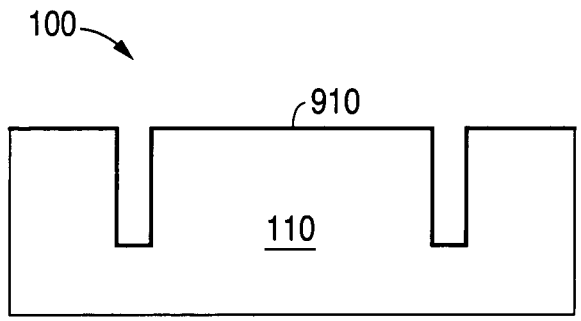
Figure 10:
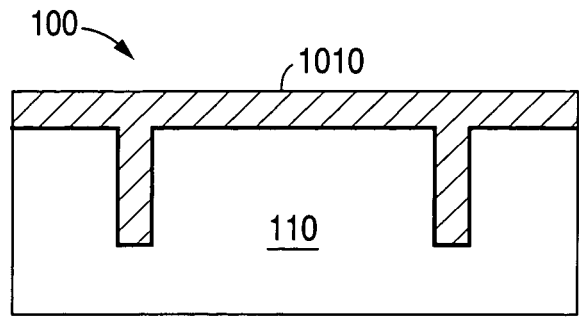

Then the silicon dioxide layer 210 is removed. The result of performing this step is shown in FIG. 8. Then a silicon dioxide liner 910 is grown on the monocrystalline silicon substrate layer 110 in which the two trenches have been etched. The result of performing this step is shown in FIG. 9. Then a layer of polysilicon 1010 is deposited using a low pressure chemical vapor deposition (LPCVD) process. The result of performing the LPCVD process to deposit the polysilicon 1010 is shown in FIG. 10. The two trenches are filled with polysilicon material 1010.

Figure 11:
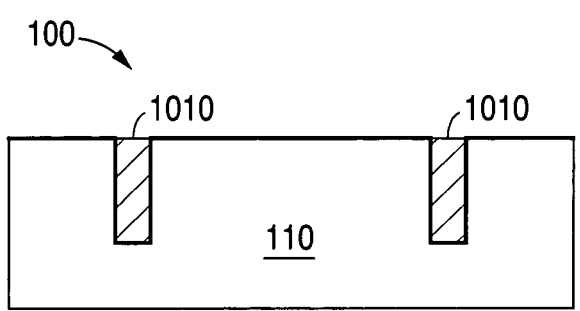

Then a polysilicon etchback process is performed to etch away the top layer of the polysilicon 1010. The result of performing the polysilicon etchback process is shown in FIG. 11.

Figure 12:
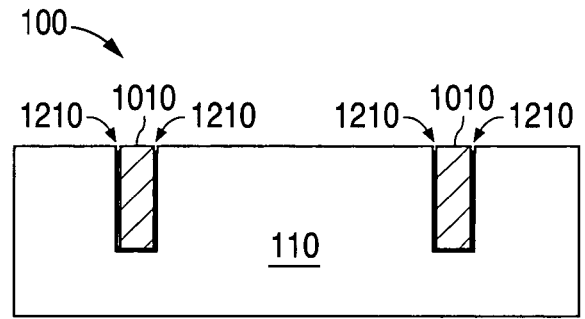
FIGS. 12 and 13 illustrate problems that may be encountered with prior art isolation trench structures.

FIG. 12 illustrates one of the problems with prior art isolation trenches. Subsequent cleans and oxide etches may remove portions of the silicon dioxide liner 910 from the interface between monocrystalline silicon substrate layer 110 and the polysilicon material 1010 in the trenches. Removal of the silicon dioxide liner 910 may create gaps 1210 such as those shown in FIG. 12. The gaps 1210 between the monocrystalline silicon substrate layer 110 and the polysilicon material 1010 compromise the isolation properties of the trenches and may cause a semiconductor device located between the trenches to fail. The gaps 1210 also create likely locations for incomplete etch and trapping sites for contamination.

Figure 13:
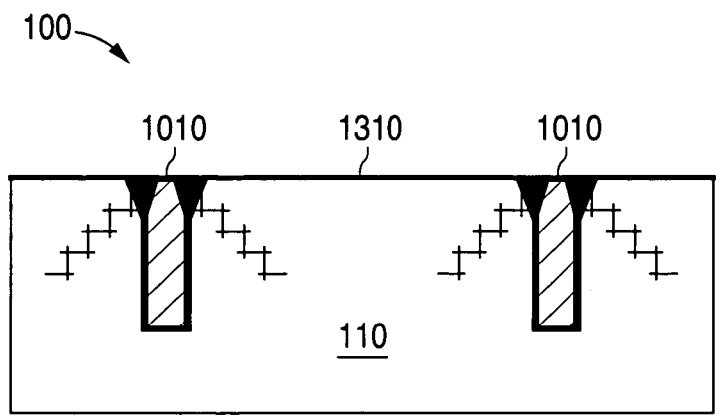

FIG. 13 illustrates another problem with the structure of prior art isolation trenches. The silicon dioxide layer 910 provides a diffusion conduit for oxidizing species (e.g., oxygen or steam) during subsequent thermal processing. This causes oxidation along the lateral seam between the polysilicon material 1010 of the trench structure and the adjacent walls of the monocrystalline silicon substrate layer 110. Because silicon dioxide occupies approximately twice as much space as the space of silicon that it consumes, the volume of material in the oxidized region of the trench expands substantially.

The expanded volume of the silicon dioxide is represented in FIG. 13 as triangular portions. The expansion of the silicon dioxide creates stresses that cause defects (e.g., cracks) in the monocrystalline silicon substrate 110 layer. These defects can lead to leakage within the semiconductor device (not shown) that the trenches are designed to isolate. It is possible that the defects can even lead to the failure of the semiconductor device.

The problems that occur with prior art isolation trenches do not exist in isolation trenches that are constructed in accordance with the principles of the present invention. An advantageous embodiment of a method of constructing isolation trenches of the present invention will now be described.

Figure 14:
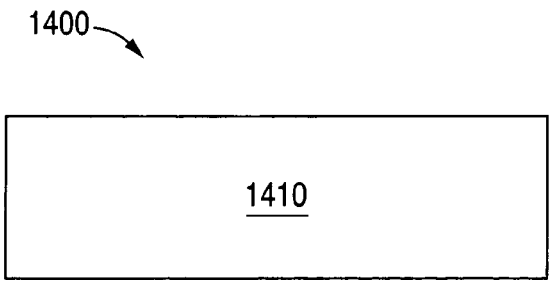
FIGS. 14 through 26 illustrate successive stages in the construction of two isolation trench structures in accordance with the principles of the present invention.
Figure 15:
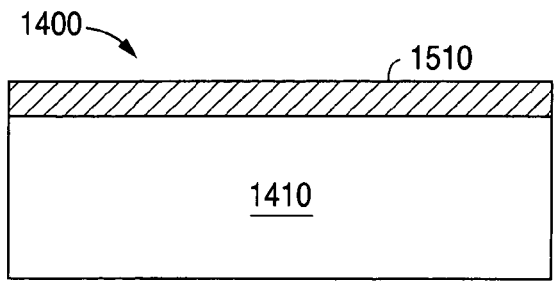

FIG. 14 illustrates a first stage in the construction of an isolation trench structure 1400 of the present invention. The construction of isolation trench structure 1400 begins by providing a monocrystalline silicon substrate layer 1410. As shown in FIG. 15, a thick silicon dioxide layer 1510 is applied to the top of the monocrystalline silicon substrate layer 1410. This is done because a silicon trench etch procedure (to be subsequently performed) attacks photoresist much faster than oxide, and because a top oxide layer during a silicon trench etch procedure enables the tapering of the trench from top to bottom. In addition, the thickness of the silicon dioxide layer 1510 is optimized to control the height of a raised portion of polysilicon that will be subsequently added.

Figure 16:
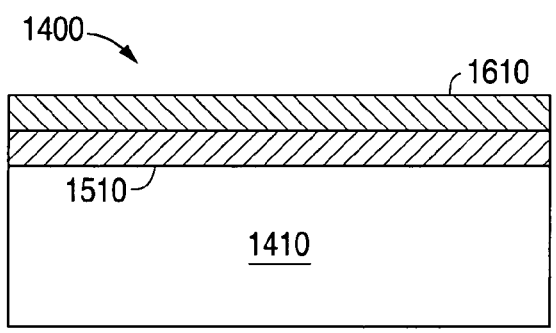
Figure 17:
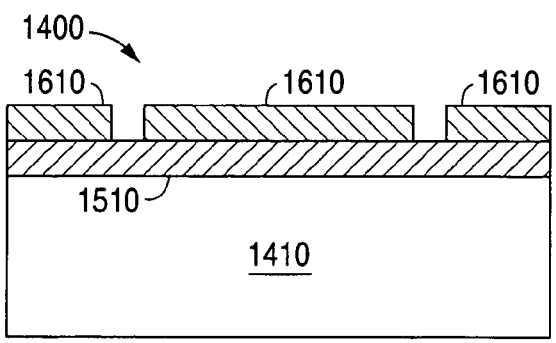
Figure 18:
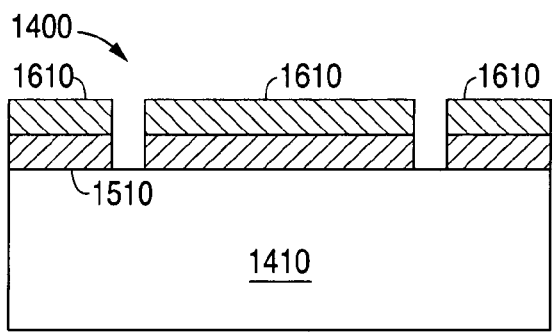

A layer of photoresist 1610 is then applied on top of the silicon dioxide layer 1510. The result of this step is shown in FIG. 16. Then the photoresist 1610 is selectively exposed and developed from the trench area. The result of this step is shown in FIG. 17. Then portions of the silicon dioxide layer 1510 are etched anisotropically in the trench areas. Photoresist 1610 protects the silicon dioxide 1510 that underlies the photoresist 1610. The result of this step is shown in FIG. 18.

Figure 19:
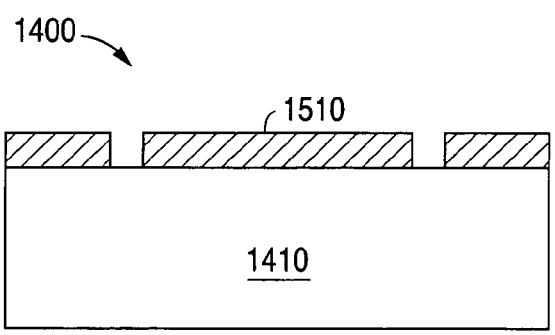

Usually the photoresist 1610 is removed before the silicon trench etch procedure is applied. The result of removing the photoresist 1610 is shown in FIG. 19. If the photoresist 1610 is not removed at this stage then it is removed after the silicon trench etch procedure is performed and before further processing occurs.

Figure 20:
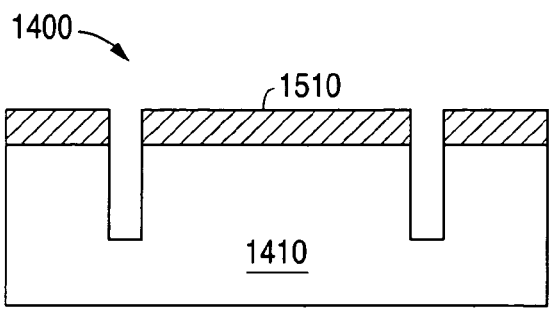

Then the silicon trench etch procedure is performed. The result of performing the silicon trench etch procedure is shown in FIG. 20. The silicon trench etch procedure will also etch the photoresist 1610 if the photoresist 1610 is still present on top of the silicon dioxide layer 1510. The silicon trench etch procedure will also etch the silicon dioxide layer 1510 if the photoresist 1610 has already been removed.

Figure 21:
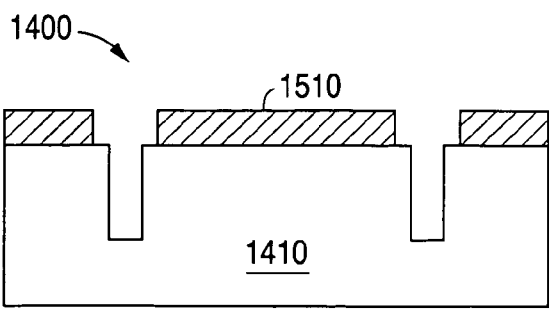

Then portions of silicon dioxide layer 1510 are etched away as shown in FIG. 21. The portion of silicon dioxide layer 1510 are etched isotropically. The height of the remaining silicon dioxide layer 1510 and the distance that the silicon dioxide layer 1510 is pulled back from the trench edge are optimized based on subsequent processing to be performed.

Figure 22:
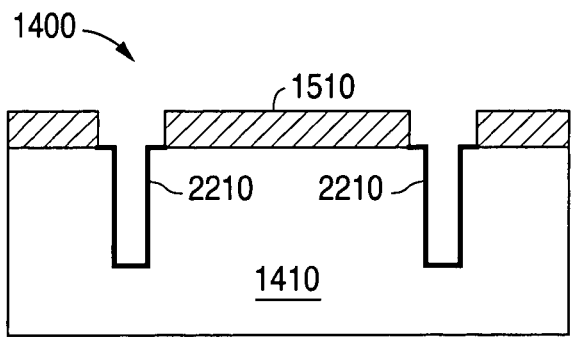

Then a silicon dioxide liner 2210 is grown on the monocrystalline silicon substrate layer 1410 in which the two trenches have been etched. The silicon dioxide liner 2210 covers the walls and bottom of the trenches. The silicon dioxide liner 2210 also covers the horizontal surfaces at the trench edges. The result of performing this step is shown in FIG. 22.

Figure 23:
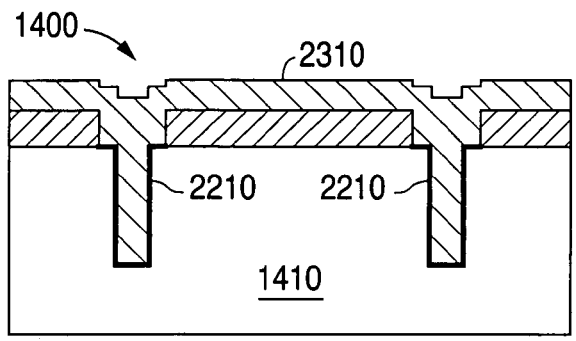

Then a layer of polysilicon 2310 is deposited using a low pressure chemical vapor deposition (LPCVD) process. The result of performing the LPCVD process to deposit the polysilicon 2310 is shown in FIG. 23. The two trenches are filled with polysilicon material 2310.

Figure 24:
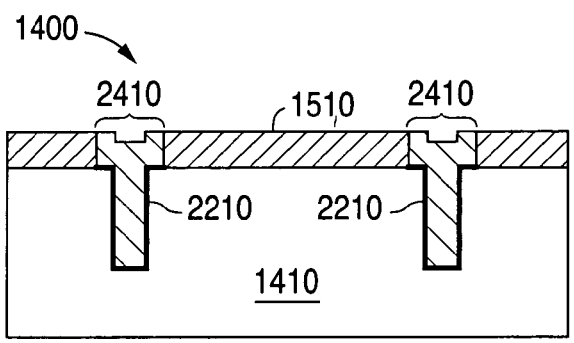

Then a polysilicon etchback process is performed to etch away the top layer of the polysilicon 2310. The result of performing the polysilicon etchback process is shown in FIG. 24. Unlike the prior art polysilicon etchback process that has been previously described, the polysilicon etchback process of the present invention does not etch the polysilicon 2310 all the way down to the monocrystalline silicon substrate layer 1410.

The polysilicon etchback process of the present invention leaves a portion of polysilicon 2310 on top of each polysilicon filled trench. The portion of polysilicon 2310 that is located over the top of each polysilicon filled trench extends laterally over the edges of the trench in a shape that suggests the form of a nailhead. For this reason the portion of polysilicon 2310 that is located over the top of each polysilicon filled trench will be referred to as a polysilicon nailhead 2410. The initial height of silicon dioxide layer 1510 and the overetch height of the polysilicon 2310 are optimized to establish an appropriate height for the polysilicon nailhead 2410. The height of polysilicon nailhead 2410 must be sufficient for the polysilicon nailhead 2410 to survive subsequent etches and oxidations.

Figure 25:
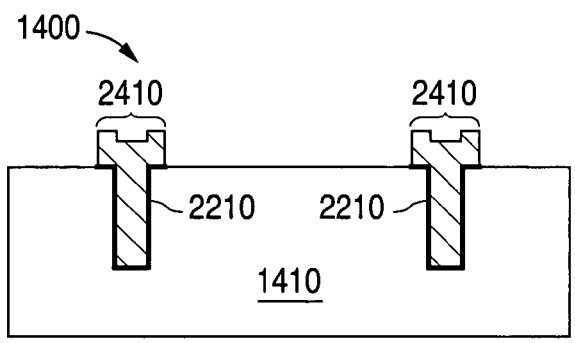
Figure 26:
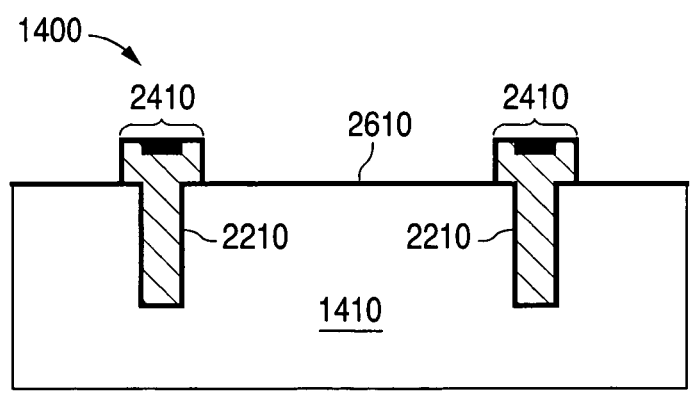

Then the silicon dioxide layer 1510 is stripped away. The result of stripping away silicon dioxide layer 1510 is shown in FIG. 25. The polysilicon nailhead 2410 protects the silicon dioxide liner 2210.

During subsequent oxidations the silicon dioxide liner 2210 located between the polysilicon 2310 in the trenches and the surrounding monocrystalline silicon substrate layer 1410 is protected. Consider a subsequent oxidation that creates silicon dioxide layer 2610. During the oxidation process the external surface of polysilicon nailhead 2410 is oxidized. But the oxidation process can not reach the protected silicon dioxide liner 2210. There is no increase in volume in the silicon dioxide liner 2210 because the oxidized polysilicon nailhead 2410 can expand laterally and vertically. Therefore, there is no stress due to volume increase of the silicon dioxide liner 2210. The absence of stress means that there will be no defects in the surrounding monocrystalline silicon substrate layer 1410.

Figure 27:
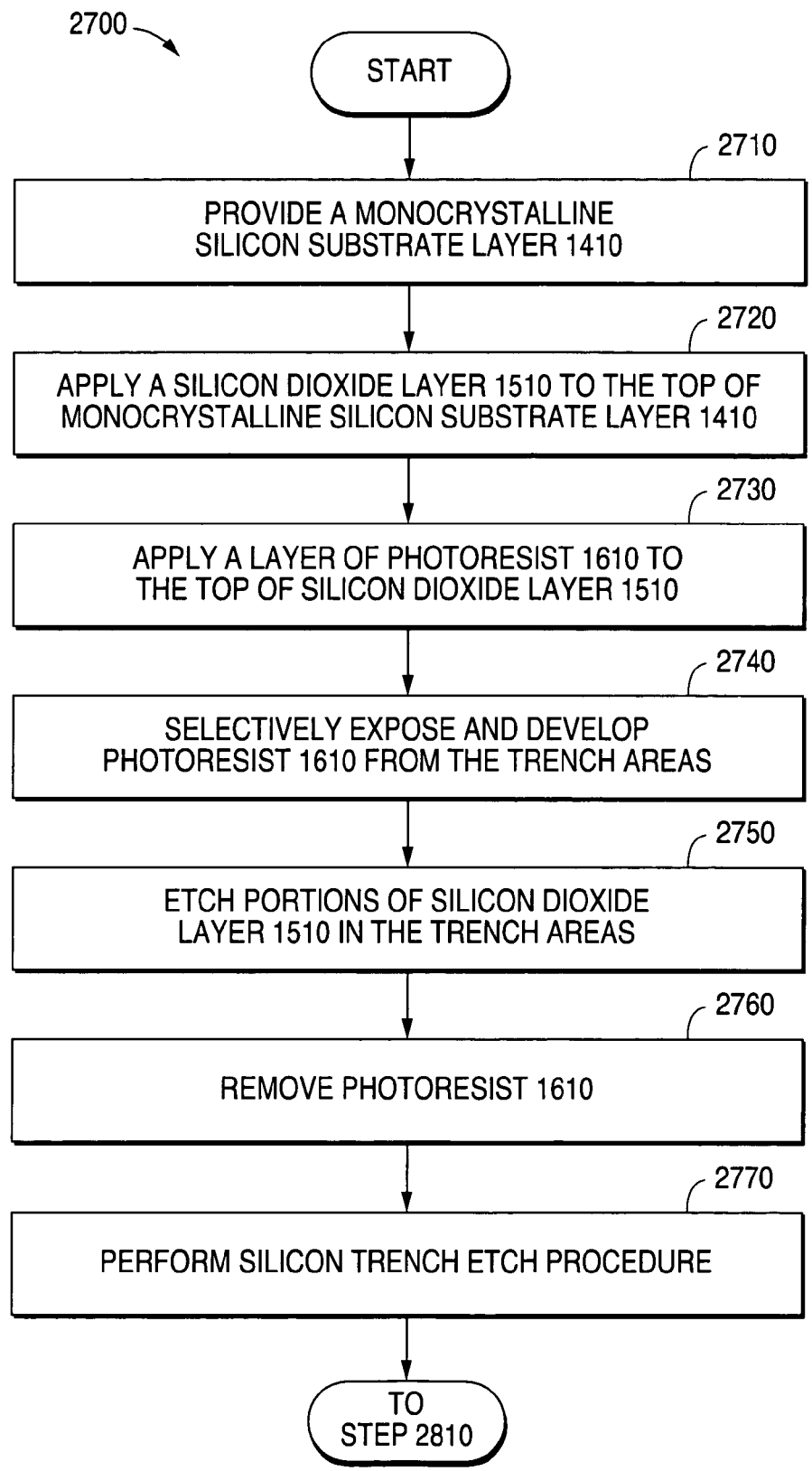
FIG. 27 illustrates a flow chart showing the steps of a first portion of an advantageous embodiment of the method of the present invention.

FIG. 27 illustrates a flow chart 2700 showing the steps of a first portion of an advantageous embodiment of the method of the present invention. The manufacture of isolation trench structure 1400 of the present invention begins by providing monocrystalline silicon substrate layer 1410 (step 2710). Then a thick silicon dioxide layer 1510 is applied to the top of the monocrystalline silicon substrate layer 1410 (step 2720). Then a layer of photoresist 1610 is then applied on top of the silicon dioxide layer 1510 (step 2730). Then the photoresist 1610 is selectively exposed and developed from the trench area (step 2740). Then portions of the silicon dioxide layer 1510 are etched anisotropically in the trench areas (step 2750).

Then the photoresist 1610 is removed before the silicon trench etch procedure is applied (step 2760). Then the silicon trench etch procedure is performed (step 2770). Control then passes to step 2210 of FIG. 28.

Figure 28:
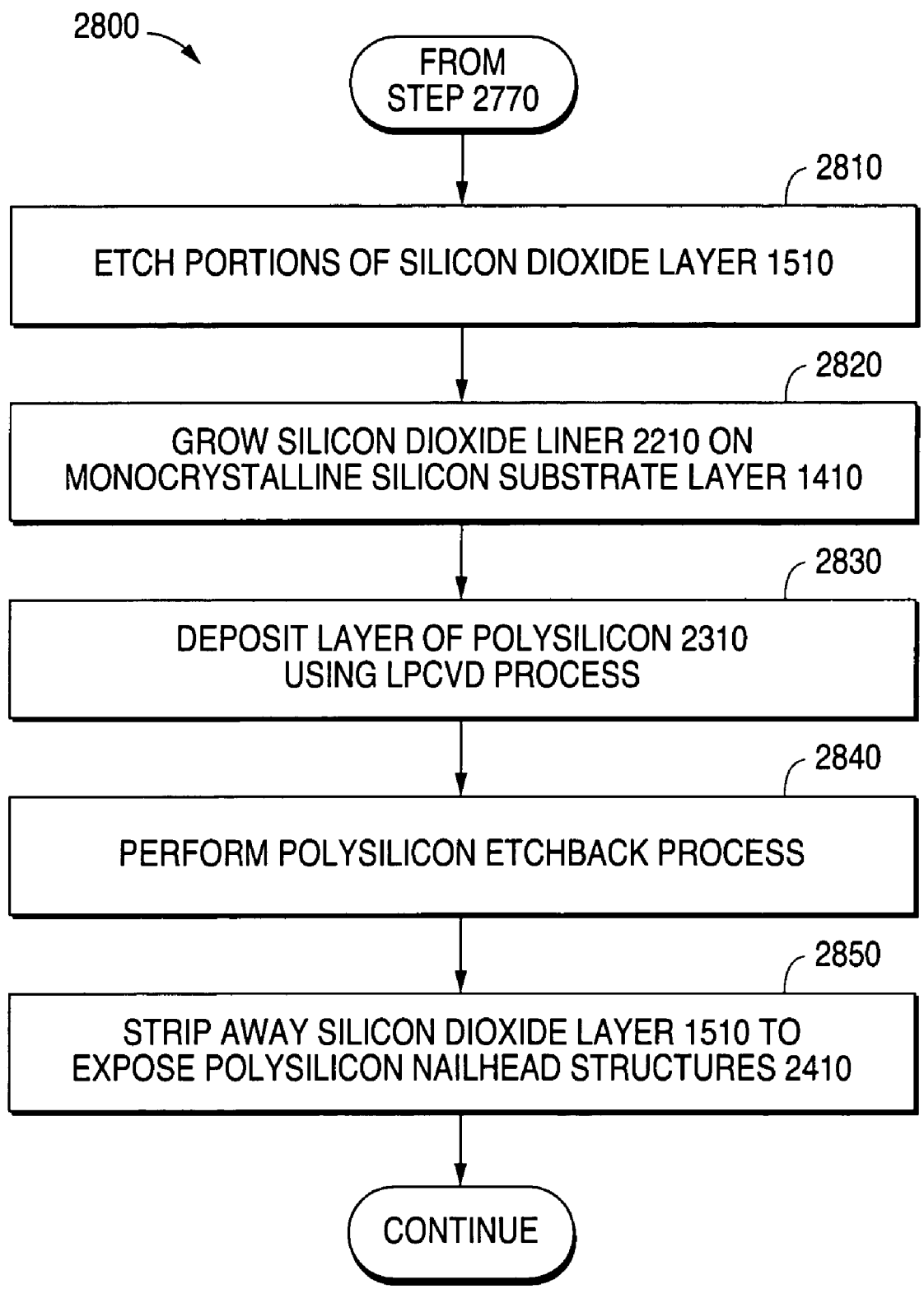
FIG. 28 illustrates a flow chart showing the steps of a second portion of an advantageous embodiment of the method of the present invention.

FIG. 28 illustrates a flow chart 2800 showing the steps of a second portion of an advantageous embodiment of the method of the present invention. Control passes to step 2810 from step 2770 of FIG. 27. Then portions of silicon dioxide layer 1510 are etched away to pull silicon dioxide layer 1510 back from the trench edge (step 2810). Then a silicon dioxide liner 2210 is grown on the monocrystalline silicon substrate layer 1410 (step 2820). The silicon dioxide liner 2210 covers the walls and bottom of the trenches and the horizontal surfaces at the trench edges.

Then a layer of polysilicon 2310 is deposited using a low pressure chemical vapor deposition (LPCVD) process (step 2830). Then a polysilicon etchback process is performed to etch away the top layer of the polysilicon 2310 (step 2840). Then the silicon dioxide layer 1510 is stripped away leaving polysilicon nailhead structures 2410 exposed (step 2850). These steps form the trench isolation structure 1400 of the present invention.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing an isolation trench in a semiconductor device, said method comprising the steps of:
   providing a substrate for said semiconductor device;
   etching a trench in said substrate;
   growing a silicon dioxide liner in said trench;
   filling said trench with polysilicon material;
   depositing polysilicon material on top of said filled trench to protect said silicon dioxide liner;
   etching the deposited polysilicon material so as to leave a portion of the deposited polysilicon material that is over the trench and that extends laterally over at least one edge of the trench, wherein the portion of the deposited polysilicon material comprises a top and a side, the side extending from the top of the portion of the deposited polysilicon material to one of: the silicon dioxide liner and the substrate; and
   placing a layer of oxidation material over the portion of the deposited polysilicon material during a subsequent oxidation process, wherein the layer of oxidation material contacts the top and the side of the portion of the deposited polysilicon material.

2. The method as set forth in claim 1 wherein said step of depositing polysilicon material on top of said filled trench to protect said silicon dioxide liner comprises the step of:
   forming said polysilicon material that is placed on top of said filled trench with portions that extend laterally over all edges of said filled trench.

3. The method as set forth in claim 1 wherein said step of growing a silicon dioxide liner in said trench further comprises the step of:
   growing said silicon dioxide liner on horizontal portions of said substrate that are adjacent to the filled trench.

4. The method as set forth in claim 3 wherein the portion of the deposited polysilicon material extends laterally over said horizontal portions of said substrate that are covered with the silicon dioxide liner.

5. The method as set forth in claim 1 further comprising the step of:
   selecting an initial height of said polysilicon material that is deposited on top of said filled trench that is sufficient for said polysilicon material to survive one of: at least one subsequent etch procedure and at least one subsequent oxidation procedure.

6. A method for manufacturing an isolation trench in a semiconductor device, said method comprising the steps of:
   providing a monocrystalline silicon substrate layer for said semiconductor device;
   applying a silicon dioxide layer over said monocrystalline silicon substrate layer;
   applying a layer of photoresist over said silicon dioxide layer;
   exposing and developing said photoresist from a trench area;
   etching portions of said silicon dioxide layer in said trench area;
   removing said photoresist;
   etching a trench in said trench area of said monocrystalline silicon substrate layer;
   etching portions of said silicon dioxide layer to pull back said silicon dioxide layer from at least one edge of said trench;
   growing a silicon dioxide liner in said trench;
   filling said trench with polysilicon material;
   depositing polysilicon material on top of said filled trench to protect said silicon dioxide liner;
   etching the deposited polysilicon material so as to leave a portion of the deposited polysilicon material that is over the trench and that extends laterally over the at least one edge of the trench, wherein the portion of the deposited polysilicon material comprises a top and a side, the side extending from the top of the portion of the deposited polysilicon material to one of: the silicon dioxide liner and the substrate; and
   placing a layer of oxidation material over the portion of the deposited polysilicon material during a subsequent oxidation process, wherein the layer of oxidation material contacts the top and the side of the portion of the deposited polysilicon material.

7. The method as set forth in claim 6 wherein said step of depositing polysilicon material on top of said filled trench to protect said silicon dioxide liner comprises the step of:
   forming said polysilicon material that is placed on top of said filled trench with portions that extend laterally over all edges of said filled trench.

8. The method as set forth in claim 6 wherein said step of growing a silicon dioxide liner in said trench further comprises the step of:
   growing said silicon dioxide liner on horizontal portions of said substrate that are adjacent to the filled trench.

9. The method as set forth in claim 8 wherein the portion of the deposited polysilicon material extends laterally over said horizontal portions of said substrate that are covered with the silicon dioxide liner.

10. The method as set forth in claim 6 further comprising the step of:
    selecting an initial height of said polysilicon material that is deposited on top of said filled trench that is sufficient for said polysilicon material to survive one of: at least one subsequent etch procedure and at least one subsequent oxidation procedure.

11. A method, comprising:
growing a silicon dioxide liner in a trench of a substrate;
depositing polysilicon material in the trench and on top of the trench;
etching the deposited polysilicon material so as to leave at least one portion of the deposited polysilicon material that is over the trench and that extends laterally over at least one edge of the trench, wherein the at least one portion of the deposited polysilicon material comprises a top and a side, the side extending from the top of the at least one portion of the deposited polysilicon material to one of: the silicon dioxide liner and the substrate; and
placing a layer of oxidation material over the at least one portion of the deposited polysilicon material during a subsequent oxidation process, wherein the layer of oxidation material contacts the top and the side of the portion of the deposited polysilicon material.

12. The method of claim 11, wherein depositing the polysilicon material comprises depositing the polysilicon material on top of the trench with portions that extend laterally over all edges of the trench.

13. The method of claim 11, wherein growing the silicon dioxide liner comprises growing the silicon dioxide liner on one or more horizontal portions of the substrate adjacent to the trench.

14. The method of claim 13, wherein the at least one portion of the polysilicon material extends laterally over the at least one horizontal portion of the substrate covered with the silicon dioxide liner.

15. The method of claim 11, wherein placing the layer of oxidation material over the at least one portion of the deposited polysilicon material comprises depositing the layer of oxidation material during a subsequent oxidation process.

16. The method of claim 11, further comprising selecting an initial height of the polysilicon material that is deposited on top of the trench, the initial height sufficient for the polysilicon material to survive at least one of: a subsequent etch procedure and a subsequent oxidation procedure.

17. The method of claim 11, wherein growing the silicon dioxide liner comprises growing the silicon dioxide liner on one or more horizontal portions of the substrate; and further comprising stripping away any exposed portions of the silicon dioxide liner after etching of the deposited polysilicon material.

18. The method of claim 11, wherein placing the layer of oxidation material over the at least one portion of the deposited polysilicon material comprises:

creating a silicon dioxide layer over the at least one portion of the deposited polysilicon material.

* * * * *